United States Patent
O'Brien

(10) Patent No.: US 6,277,743 B1
(45) Date of Patent: Aug. 21, 2001

(54) METHOD OF FABRICATING SELF-ALIGNED SILICIDE

(75) Inventor: Sean C. O'Brien, Addison, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/344,649

(22) Filed: Jun. 25, 1999

Related U.S. Application Data

(60) Provisional application No. 60/090,669, filed on Jun. 25, 1998.

(51) Int. Cl.[7] .................................... H01L 21/44
(52) U.S. Cl. ..................... 438/682; 438/233; 438/586; 438/649; 438/976
(58) Field of Search ...................... 438/682, 233, 438/586, 664, 453, 683, 655, 660, 649, 685, 906, 976, 605, 651; 148/DIG. 147

(56) References Cited

U.S. PATENT DOCUMENTS

| | | | |
|---|---|---|---|
| 5,043,300 | * 8/1991 | Nulman | 438/655 |
| 5,635,426 | * 6/1997 | Hayashi et al. | 438/682 |
| 5,728,625 | * 3/1998 | Tung | 438/586 |
| 5,918,143 | * 6/1999 | Beauvais et al. | 438/607 |
| 5,953,633 | * 9/1999 | Chen et al. | 438/683 |

* cited by examiner

Primary Examiner—Matthew Smith
Assistant Examiner—Igwe U. Anya
(74) Attorney, Agent, or Firm—Calton H. Hoel; W. James Brady; Frederick J. Telecky, Jr.

(57) ABSTRACT

Self-aligned silicidation (e.g., Ti, Co, or Ni silicides) for silicon integrated circuits with an HF-based final etch of the silicide to remove filaments. Either ultradilute HF solution or HF vapor may be used.

12 Claims, 2 Drawing Sheets

US 6,277,743 B1

1

METHOD OF FABRICATING SELF-ALIGNED SILICIDE

CROSS-REFERENCE TO RELATED APPLICATIONS

This application claims the benefit of Provisional No. 60/090,669 filed Jun. 25, 1998.

Copending U.S. patent application Ser. No. 08/670,380, filed Jun. 25, 1996, U.S. patent application Ser. No. 08/670,381, filed Jun. 25, 1996, and U.S. patent application Ser. No. 09/045,009, filed Mar. 20, 1998, disclose related subject matter and have a common assignee with the present application.

BACKGROUND OF THE INVENTION

The invention relates to electronic semiconductor devices, and, more particularly, to fabrication methods for such devices.

Semiconductor integrated circuits with high device density require minimum size structures such as short gates and shallow source/drain junctions for field effect transistors ("FET"s), small area emitters for bipolar transistors, and narrow interconnection lines between devices. Short gates and narrow interconnection lines lead to higher resistance for the typical polysilicon gates and first level interconnection lines, and this increases RC time delays and slows circuit operation.

One approach to reduce the resistance of polysilicon gates and interconnection lines uses a self-aligned metal silicide on top of the polysilicon; the metal may be refractory metals such as titanium, cobalt, and nickel. The silicidation process first deposits a blanket film of metal and then reacts the metal with any underlying silicon but not underlying insulator such as silicon oxide (a nitrogen atmosphere may used to simultaneously form the metal nitride to inhibit silicon diffusion). Lastly, the process removes the metal (plus any metal nitride) which did not become silicide. For example, see U.S. Pat. No. 4,821,085 discloses titanium metal and in a nitrogen atmosphere titanium nitride forms.

The removal of metal (and metal nitride) in this self-aligned silicide process requires a very high selectivity with respect to removal of the metal silicide, otherwise the metal silicide will be thinned and lose the advantages of siliciding. For example, the stripping of titanium nitride with the standard basic SC1 solution (12.5% ammonium hydroxide solution, 12.5% hydrogen peroxide solution, and 75% water) at room temperature has a selectivity with respect to titanium silicide of roughly 7.8 to 1. This low selectively presents problems in the known silicide processes.

SUMMARY OF THE INVENTION

The present invention provides self-aligned silicidation methods with HF etching.

Preferred embodiments use an acidic strip of metal (e.g., titanium, cobalt, nickel) and metal nitrides (e.g., TiN) plus an etch with HF of silicide filaments such as have grown on insulators.

A silicide phase conversion step may be inserted between the metal/nitride and silicide etches.

Advantages include simplicity of the removal of metal/nitride plus silicide filaments with selectivity and control for the silicides for titanium, cobalt, and nickel.

2

BRIEF DESCRIPTION OF THE DRAWINGS

The drawings are heuristic for clarity.

DESCRIPTION OF THE PREFERRED EMBODIMENTS

Overview

Figure 1A:
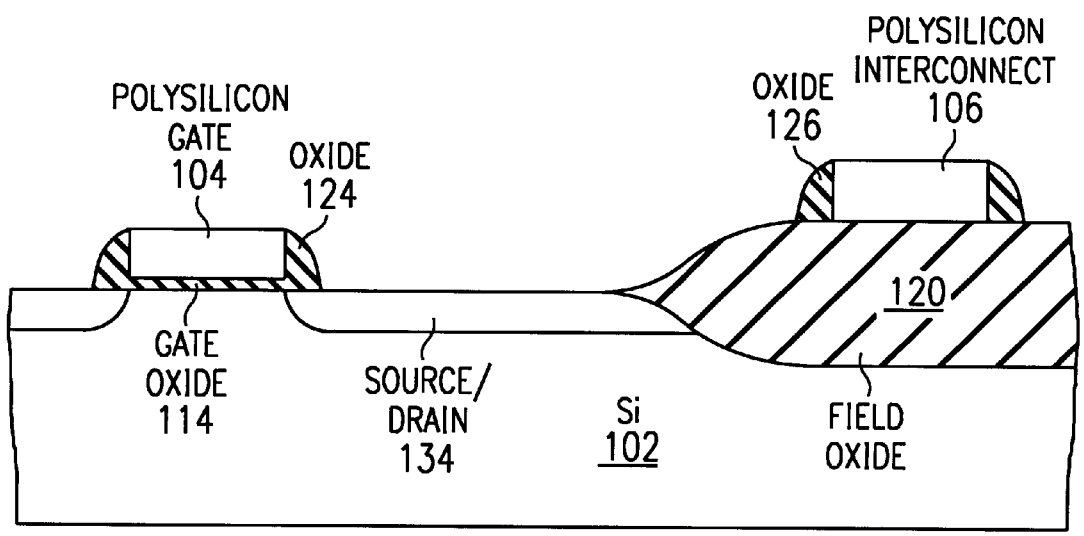
FIGS. 1a–d illustrate in cross sectional elevation views steps of a first preferred embodiment method.
Figure 1B:
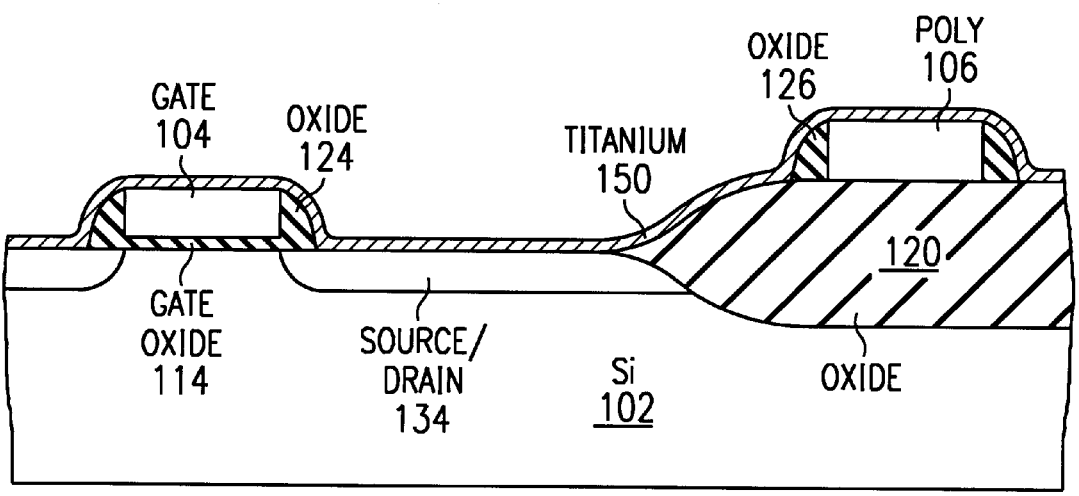

The preferred embodiment methods combine an HF metal silicide etch with a strip of residual metal (and metal nitrides) which arise during self-aligned silicidation processes using metals such as titanium, cobalt, and nickel. For titanium silicidation, strip unreacted Ti and TiN with an acidic peroxide such as HCl and then etch titanium silicide filament and polymeric residue with ultradilute HF solution. An anneal to convert from C49 phase upon silicidation reaction to lower resistivity C54 phase may be inserted between the acid and the ultradilute HF steps.

Alternatively, a vapor HF etch in place of the ultradilute HF solution may be used; this provides an advantage in difficult to etch silicides such as cobalt silicide.

First preferred embodiment

FIGS. 1a–d illustrate in cross sectional elevation views the first preferred embodiment self-aligned titanium silicide method which includes the following steps.

(1) Start with silicon substrate 102 having polysilicon gate 104 on gate insulator silicon dioxide (gate oxide) 114 with gate 104 having sidewall oxide 124 for alignment of source/drains 134 and with field oxide 120 for transistor isolation. Also, polysilicon interconnect line 106 with sidewall oxide 126 may run over field oxide 120. Typically, the polysilicon gates and the field oxide each extend about 0.3 μm above the substrate surface, so the top of poly interconnect 108 lies about 0.6 μm above the substrate surface. Gate oxide 114 may be about 6 nm thick and source/drains 134 about 0.15 μm deep. See FIG. 1a which illustrates a gate length and poly interconnect width of roughly 0.5 μm.

(2) Sputter deposit titanium 150 to a thickness of about 40 nm. Titanium 150 coverage on the sloping sidewall oxides 124–126 and field oxide 120 is not crucial because this portion of titanium 150 will not form $TiSi_2$ and will be stripped in a subsequent step. See FIG. 1b.

(3) Insert the titanium coated substrate into a nitrogen (plus optional hydrogen) atmosphere and raise the temperature to roughly 750 C. for roughly 30 seconds to drive the silicidation reaction for the portion of titanium 150 abutting silicon; namely, the surfaces of gate 104, poly interconnect 106, and source/drain 134:

$$Ti + 2Si \rightarrow TiSi_2$$

Silicon diffuses through $TiSi_2$, so the $TiSi_2$ grows from gate 104, poly 106, and source/drain 134. (This $TiSi_2$ is the metastable C49 phase and will be converted to the stable C54 phase in a subsequent anneal.) A competing reaction with the nitrogen from the atmosphere diffusing into the titanium limits the $TiSi_2$ growth:

$$Ti + \tfrac{1}{2}N_2 \rightarrow + TiN$$

The titanium on oxides 120, 124, and 126 only slightly reduces the abutting oxide before nitrogen diffusing from the atmosphere will convert the titanium to TiN. Thus only a small amount of titanium oxide forms:

$$Ti + SiO_2 \rightarrow TiO_2 + Si$$

Figure 1C:
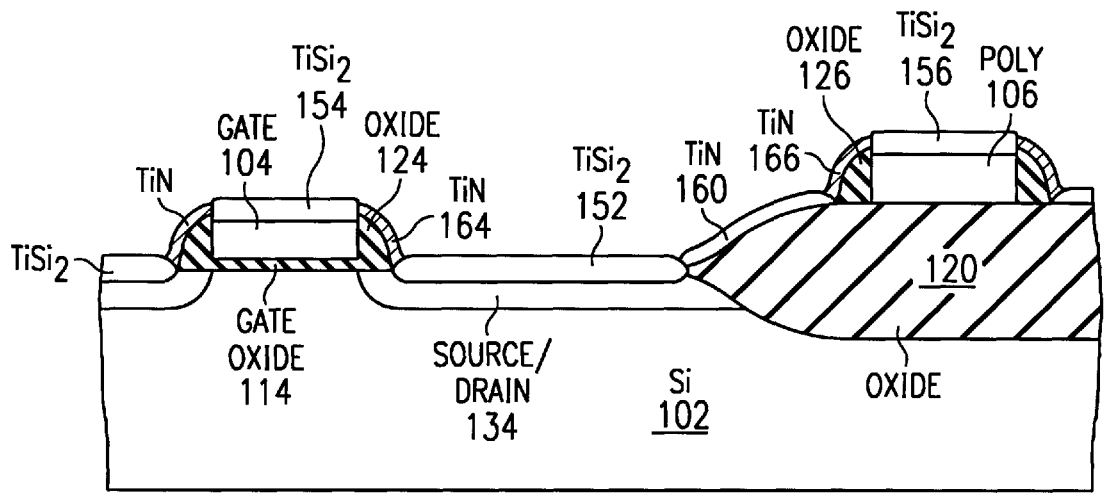
Figure 1D:
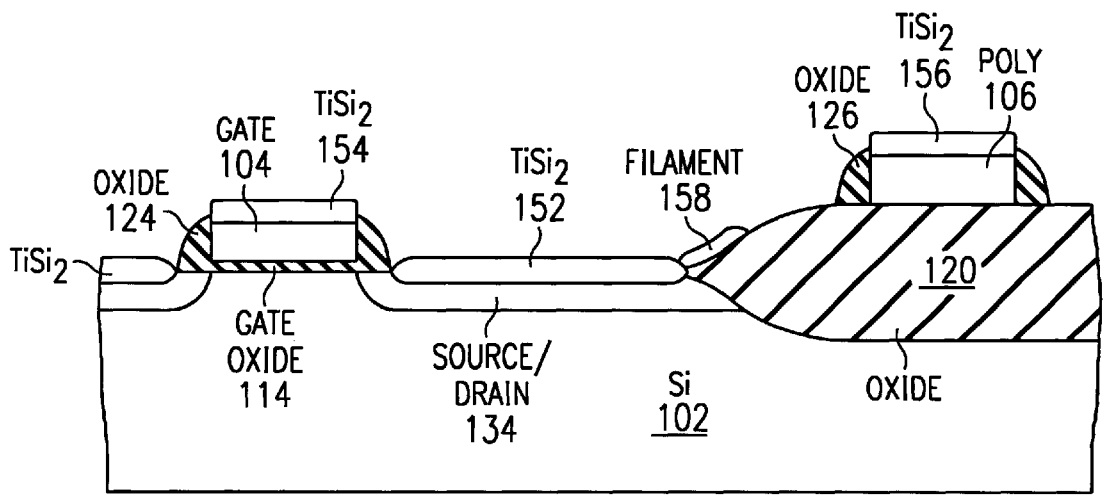

And some titanium remains unreacted as Ti metal. See FIG. 1c showing TiSi$_2$ 152 formed on source/drain 134, TiSi$_2$ 154–156 formed on gate 104 and poly 106, and TiN 160-164-166 formed on oxides 120-124-126. The top surfaces of TiSi$_2$ 152-154-156 typically contain some TiN which forms prior to the diffusing silicon arriving to form silicide. The TiSi$_2$ will be roughly 80 nm thick and the TiN roughly 60 nm thick.

(4) Immerse the silicided/nitrided substrate in a solution of HCl and H$_2$O$_2$ in water such as standard SC2 at 50 C. for roughly 10 minutes. This solution strips Ti and TiN at about 5 nm/min, but only removes TiSi$_2$ at about 0.01 nm/min; thus a 100% overetch strip removes the 60 nm of TiN but only about 0.1 nm of the TiSi$_2$. The ratio of HCl:H$_2$O$_2$:H$_2$O may be in the range of 1:1:100 to 1:1:5; and the selectivity of etching TiN with respect to TiSi$_2$ is greater than 100 to 1.

Next, rinse the substrate in deionized water and then immerse it in a solution of 0.2 M HF in water at 25 C. for roughly 1 minute. This etches TiSi$_2$ plus polymeric residues at roughly 0.1–0.3 nm/min and eliminates TiSi$_2$ filaments; see FIG. 1d. Indeed, for such ultradilute HF solutions the etch rate is approximately proportional to the HF concentration, so the etch rate can be adjusted to yield a convenient immersion time. Contrarily, the use of a dilute NH$_4$OH solution instead of HF for the filament etch has the problem of NH$_3$ evaporating from the bath, so control of the concentration (and thus etch rate) becomes difficult.

Note that using SC1 (which has an etch rate selectivity of 7.8 to 1 for TiN to TiSi$_2$) for the stripping of the TiN plus silicide filaments with a 100% overetch would remove roughly 15 nm of TiSi$_2$, or about 20%, which is excessive.

(5) Lastly, rinse the silicided substrate clean and then anneal in a forming gas (nitrogen plus hydrogen) atmosphere at roughly 900 C. for 10 seconds to convert the TiSi$_2$ from metastable C49 phase to stable C54 phase and thereby lower the resistivity from roughly 75 microohm-cm to roughly 15 microohm-cm. This completes the siliciding, and further steps of forming metal level interconnections, passivation, wire bonding, and packaging complete the integrated circuit.

The acidic strip of metal and the ultradilute HF etch of silicide filaments could be combined into a single immersion by simply adding HF to the 0.1 M HCl or SC2 solution to achieve a 0.2 M HF solution.

Second preferred embodiment

A second preferred embodiment method follows steps (1)–(5) of the first preferred embodiment but moves the ultradilute HF etch of silicide filaments and polymeric residue to after the phase conversion anneal in step (5). That is, in step (4) use only the acidic strip of TiN, and then apply the step (5) anneal to convert TiSi$_2$ from higher-resistivity metastable C49 phase to lower-resisfivity stable C54 phase. Lastly, strip silicide filaments and polymeric residue by immersing in a solution of 0.2 M HF in water at 25 C. for 1 minute. Note that TiSi$_2$ 152-154-156 on the gates, lines, and source/drains will generally be C54 phase, but narrow filaments (e.g., filament 158 in FIG. 1d) of TiSi$_2$ on oxides 120, 124, or 126 would be too narrow to convert to C54 phase during the phase conversion anneal and remain as C49 phase. Indeed, the C49 grains may average about 0.1–0.2 um diameter, and the phase conversion time (time to convert half from C49 to C54) roughly depends upon $g^2/(w-g)$ where g is the grain size and w is the filament width. So narrow filaments have a very long conversion time. Thus an etchant which etches C49 faster than C54 would be especially effective when used after the phase conversion anneal.

The delay of the TiSi$_2$ filament etch until after the phase conversion anneal (rather than at the same time as the TiN strip) allows the use of the highly selective H$_2$O$_2$ for the TiN strip in step (4) and consequent minimal loss of TiSi$_2$ on the gates, lines, and source/drains.

Cobalt preferred embodiment

Another preferred embodiment uses cobalt in place of the titanium of the foregoing preferred embodiments and proceeds with analogous steps. In particular, start with a wafer having structures as in FIG. 1a and sputter deposit cobalt to provide a structure similar to that of FIG. 1b but with cobalt in place of titanium 150. Then react the cobalt with underlying silicon at 600 C. in an atmosphere of nitrogen. The cobalt diffuses through the silicide rather than the silicon diffusing through, so the reaction does not need an atmosphere which can interact with the cobalt metal and stop silicide growth over the oxide. The reaction is:

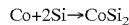

The other silicides, Co$_2$Si and CoSi, do not appear. This yields a structure analogous to that of FIG. 1c but with CoSi$_2$ in place of TiSi$_2$ and Co in place of TiN.

After the silicide formation, strip the unreacted cobalt by immersion of the wafer in a solution of sulfuric acid and H$_2$O$_2$ in a ratio of 5 to 1 (solutions in the range of about 10 to 1 down to about 2 to 1 also work well) at 90° C. The strip selectivity of Co to CoSi$_2$ is about 10000 to 1. Thus stripping 50 nm of Co will only remove about 0.005 nm of CoSi$_2$ out of an initial 100 nm.

An anneal at 800 C. may be used to ensure formation of large CoSi$_2$ grains (single crystal in narrow regions) for low resistivity.

Lastly, etch the CoSi$_2$ with ultradilute (0.2 M) or vapor phase HF to remove any unwanted filaments. The etch with vapor phase HF can remove silicide filaments which HF solutions have difficulty removing. In particular, flow HF vapor at a pressure of 700 Torr over the silicided substrate for 5 seconds to react with silicide filaments, and then rinse with deionized water. Remove about 5% of the thickness of the CoSi$_2$ to ensure elimination of filaments.

Experimentally, the use of vapor HF has decreased measured leakage current in situations where HF water solution and HCl plus H$_2$O$_2$ etching has not. Indeed, the following table presents some experimental results with the logarithm of the leakage current listed for before and after the filament etch.

| Etch system | Before etch | After etch |
| --- | --- | --- |
| HCl + H$_2$O$_2$ solution | −4.3 | −4.3 |
| HF solution | −5.1 | −5.1 |
| vapor HF | −5.0 | −8.8 |

Nickel preferred embodiment

A further preferred embodiment uses nickel in place of the cobalt of the preceding preferred embodiment and proceeds with analogous steps. In particular, start with a wafer having structures as in FIG. 1a and sputter deposit nickel to provide a structure similar to that of FIG. 1b but with nickel in place of titanium 150. Then react the nickel with underlying silicon at about 450 C. in an inert atmosphere such as nitrogen or argon. The nickel diffuses through the silicide rather than the silicon diffusing through, so the reaction does not need an atmosphere which can interact with the nickel and stop silicide growth over the oxide. The reaction is:

$Ni_2Si$ does not form. The reaction yields a structure analogous to that of FIG. 1c but with NiSi in place of $TiSi_2$ and Ni in place of TiN.

After the silicide formation, strip the unreacted nickel by immersion of the wafer in a solution of ozonated sulfuric acid ($O_3$ bubbled through $H_2SO_4$) at 90 C. The strip selectivity of Ni to NiSi is high (100 to 1) and stripping 60 nm of Ni will likely remove less than 1 nm of NiSi out of an initial 100 nm of NiSi.

NiSi does not need an anneal to increase grain size for low resistivity.

Lastly, etch the silicide with ultradilute or vapor HF to remove any unwanted filaments. The etch may be by immersion in a solution such as 0.2 M HF or by HF vapor flowed over the wafer followed by a deionized water cleanup. Remove about 5% of the thickness of the silicide to ensure elimination of filaments.

Modifications and variations

The preferred embodiments may be varied in many ways while retaining one or more of the features of a metal/nitride strip selective to silicide, optionally followed by an anneal, and then followed by a silicide etch with HF to ensure filament removal.

For example, the ultradilute HF solution may be in the range of 0.005 M to 0.5 M, this would give immersion times in the range of 10 seconds to 10 minutes for the typical silicide thicknesses of 50–500 nm. Similarly, the vapor HF may be applied in a pressure range of 50 Torr to 1000 Torr which would give exposure times in the range of 5 seconds to 5 minutes for the typical silicide thicknesses of 50–500 nm. The HF vapor may be either wet or anhydrous. And the temperatures of the ultradilute HF solution and the HF vapor may conveniently be in the range of 20 C. to 50 C.

And the structures on which self-aligned silicidation could be varied such as the silicon oxide regions could be replaced by or supplemented by regions of silicon nitride, silicon oxynitride, or other nonreactive regions.

What is claimed is:

1. A method of self-aligned silicidation, comprising the steps of:
   (a) forming a metal layer on a wafer surface which includes silicon areas and nonsilicon areas;
   (b) reacting first portions of said metal layer with said silicon areas to form metal silicide;
   (c) removing second portions of said metal layer which did not react in step (b) to form metal silicide by use of a first etchant with selectivity with respect to said metal silicide of at least 10 to 1;
   (d) after step (c) removing portions of said metal silicide with a second etchant which includes HF.

2. The method of claim 1, wherein:
   (a) said metal is selected from the group consisting of titanium, cobalt, and nickel.

3. The method of claim 1, wherein:
   (a) said metal is titanium;
   (b) said reacting of step (b) is in a nitrogen atmosphere; and
   (c) said removing of step (c) removes TiN.

4. The method of claim 1, wherein:
   (a) said first etchant of step (c) is a solution of $H_2O$, $H_2O_2$, and $NH_4OH$ with the ratio of $NH_4OH$ to $H_2O_2$ of less than 1:200.

5. The method of claim 1, wherein:
   (a) said first etchant of step (c) is a solution of $H_2O$ and $H_2O_2$ with no $NH_4OH$.

6. The method of claim 1, wherein:
   (a) said first etchant of step (c) is a solution of $H_2SO_4$ and $H_2O_2$ with the ratio of $H_2SO4$ to $H_2O_2$ the range from 10:1 to 2:1.

7. The method of claim 1, wherein:
   (a) said first etchant of step (c) is sulfuric acid through which ozone is bubbled.

8. The method of claim 1, wherein:
   (a) said first etchant of step (c) is a solution of HCl, $H_2O_2$, and $H_2O$ with the ratio of components in the range from 1:1:100 to 1:1:5.

9. The method of claim 1, wherein:
   (a) said second etchant of step (d) is a solution of $H_2O$, $H_2O_2$, and $NH_4OH$.

10. The method of claim 1, comprising the further step of:
    (a) between said steps (c) and (d) of claim 1 annealing said wafer.

11. The method of claim 1, comprising the further step of:
    (a) after said step (d) of claim 1 annealing said wafer.

12. The method of claim 1, comprising the further step of:
    (a) between said steps (c) and (d) of claim 1 drying said wafer.

* * * * *